(12) United States Patent
Ren

(10) Patent No.: US 8,236,405 B2
(45) Date of Patent: Aug. 7, 2012

(54) WATERPROOF SEAL FOR PORTABLE ELECTRONIC DEVICES

(75) Inventor: Xue-Jie Ren, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 230 days.

(21) Appl. No.: 12/578,146

(22) Filed: Oct. 13, 2009

(65) Prior Publication Data

US 2010/0118498 A1 May 13, 2010

(30) Foreign Application Priority Data

Nov. 10, 2008 (CN) .......................... 2008 1 0305473

(51) Int. Cl.
*H05K 5/02* (2006.01)
*H05K 5/00* (2006.01)
*B32B 3/10* (2006.01)

(52) U.S. Cl. .................. 428/137; 428/172; 361/679.01; 361/814; 361/749; 174/50; 174/50.5; 174/520

(58) Field of Classification Search ............. 361/679.01, 361/749, 814; 428/172, 137, 66.4; 174/135, 174/50–50.64, 68.1, 560, 520, 77; 277/921; 455/575.1–575.4
See application file for complete search history.

(56) References Cited

U.S. PATENT DOCUMENTS

| 5,491,300 | A  | * | 2/1996 | Huppenthal et al. | 174/151 |
| 5,928,033 | A  | * | 7/1999 | Kato et al. | 439/587 |
| 6,203,348 | B1 | * | 3/2001 | Fukuda | 439/275 |
| 6,521,989 | B2 | * | 2/2003 | Zhou | 257/698 |
| 6,709,253 | B2 | * | 3/2004 | Hattori et al. | 425/116 |
| 7,251,512 | B2 | * | 7/2007 | Komiyama | 455/575.3 |
| 7,596,396 | B2 | * | 9/2009 | Fagrenius et al. | 455/575.4 |
| 8,003,898 | B2 | * | 8/2011 | Hayashi et al. | 174/385 |
| 2004/0029530 | A1 | * | 2/2004 | Noguchi et al. | 455/23 |
| 2006/0032653 | A1 | * | 2/2006 | Minoshima et al. | 174/52.3 |
| 2010/0181089 | A1 | * | 7/2010 | Hayashi et al. | 174/50.5 |
| 2010/0212953 | A1 | * | 8/2010 | Hayashi et al. | 174/520 |

FOREIGN PATENT DOCUMENTS
CN 1186360 A 7/1998
* cited by examiner

*Primary Examiner* — Angel R Estrada
*Assistant Examiner* — Dimary Lopez
(74) *Attorney, Agent, or Firm* — Altis Law Group, Inc.

(57) ABSTRACT

A waterproof seal includes a first body and a second body. The first body is formed by inserting molding, and includes a first metal plate inside. The first body further includes a first flat surface, and defines a first groove in the first flat surface. The second body is formed by inserting molding, and includes a second metal plate inside. The second body further includes a second flat surface matching the first flat surface, and defines a second groove in the second flat surface. When the first flat surface clings to the second flat surface, a gap is formed between the first body and the second body for allowing a flexible printed circuit board to extend through.

16 Claims, 9 Drawing Sheets

WATERPROOF SEAL FOR PORTABLE ELECTRONIC DEVICES

BACKGROUND

1. Technical Field

The present disclosure relates to waterproof seals, particularly, to a waterproof seal for portable electronic devices such as portable telephones, portable computers, etc.

2. Description of Related Art

Portable electronic devices such as mobile phones, personal digital assistants, etc., may be classified into various categories according to their appearance. In which, flip-type portable electronic devices are becoming more and more popular. A flip-type portable electronic device generally has two housings two housing connected with each other. A flexible printed circuit board is provided to electronically connect the two housings. The housings define holes for allowing the flexible printed circuit board to extend through. However, water or water vapor could easily enter inside of the portable electronic device through the holes, which may damage the internal electronic circuitry.

Therefore, there is room for improvement within the art.

BRIEF DESCRIPTION OF THE DRAWINGS

Many aspects of the waterproof seal can be better understood with reference to the following drawings. The components in the drawings are not necessarily drawn to scale, the emphasis instead being placed upon clearly illustrating the principles of the waterproof seal. Moreover, in the drawings, like reference numerals designate corresponding parts throughout the several views, in which.

DETAILED DESCRIPTION OF THE EMBODIMENTS

Figure 1:
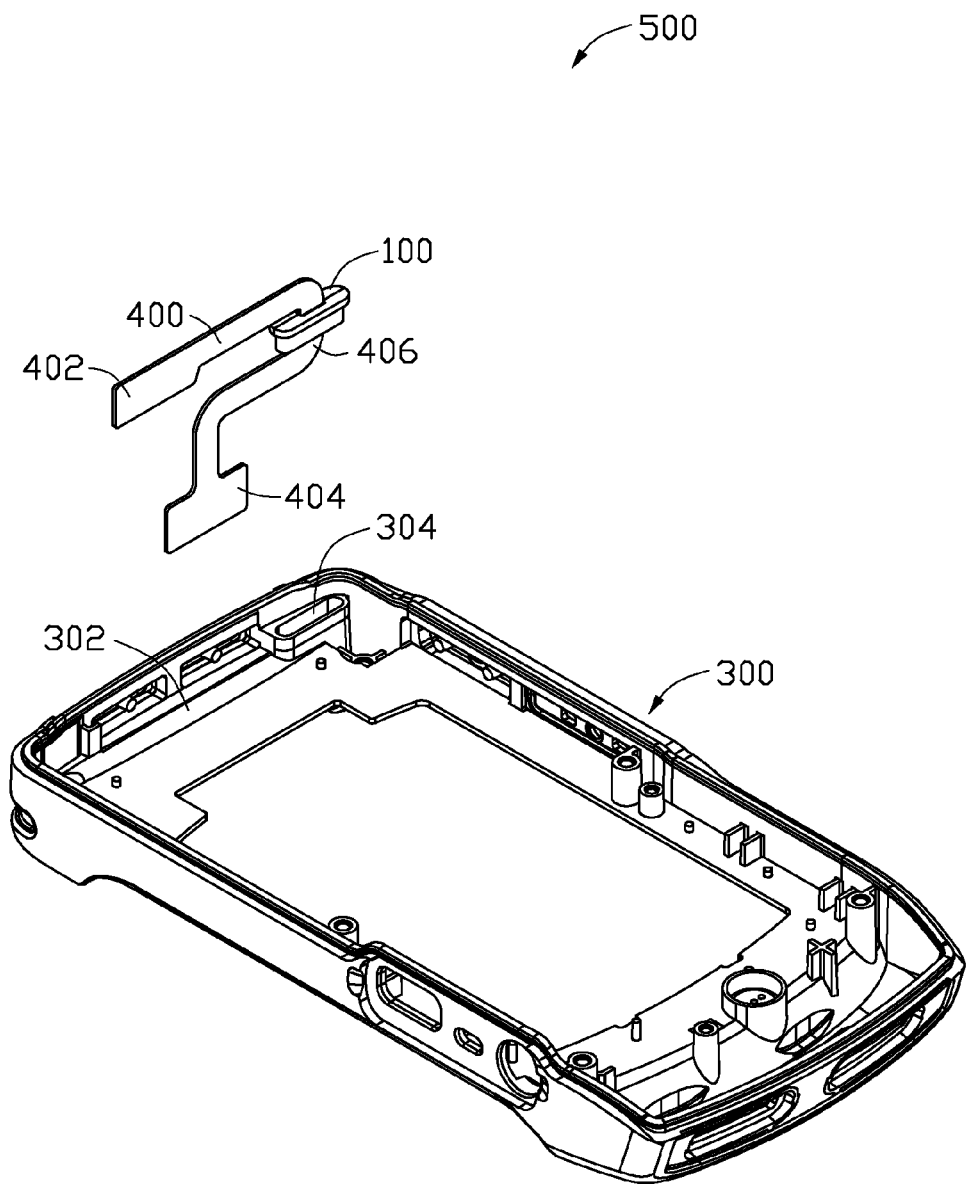
FIG. 1 is a partially, schematic view of a portable electronic device, including a housing, a waterproof seal and a flexible printed circuit board, in accordance with an exemplary embodiment.

Referring to FIG. 1, a waterproof seal 100 is applied to a portable electronic device 500 (partially shown), in accordance with an exemplary embodiment. The portable electronic device 500 includes a housing 300, a flexible printed circuit board 400, and a waterproof seal 100. The flexible printed circuit board 400 is used to electrically connect the housing 300 to another component.

The housing 300 includes an end portion 302. The end portion 302 defines a through hole 304 for receiving the waterproof seal 100.

The flexible printed circuit board 400 includes a first end 402, a second end 404 and a middle portion 406. The first end 402 and the second end 404 are respectively configured for electrically connecting internal electronic circuitry in the housing 300 and another component (not shown).

Figure 2:
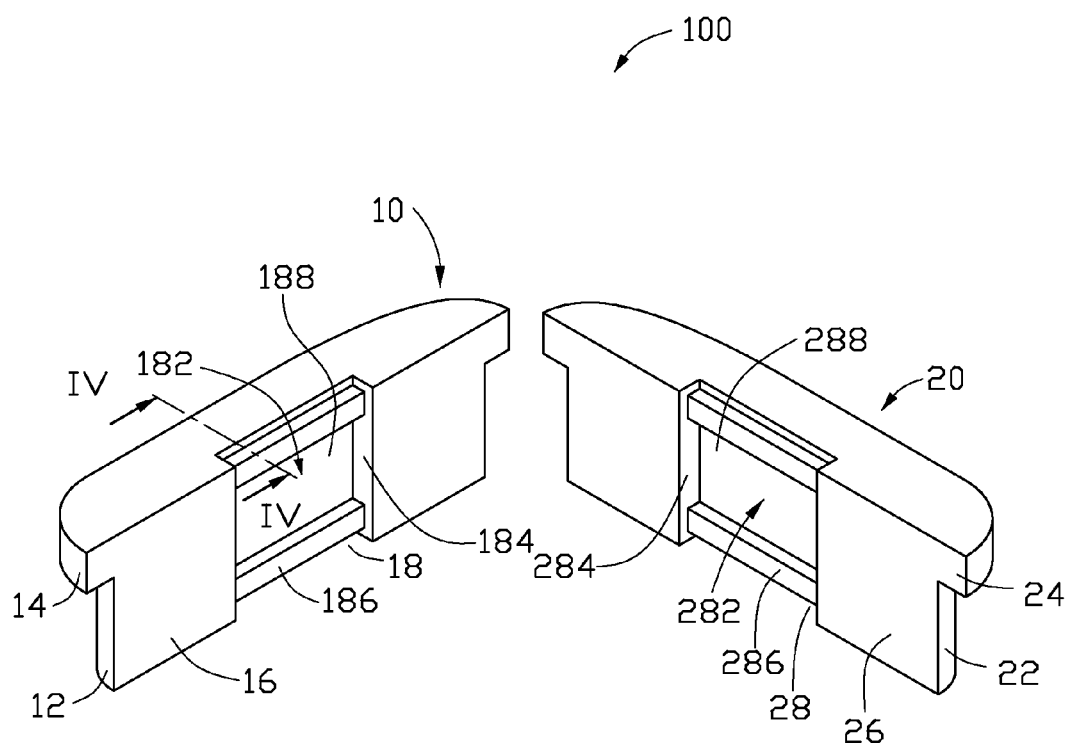
FIG. 2 is an exploded, schematic view of the waterproof seal shown in FIG. 1.

Referring to FIG. 2, the waterproof seal 100 includes a first body 10 and a second body 20. The first body 10 includes a first main portion 12 and a first flange portion 14 formed at one end of the first main portion 12. The first body 10 has a first flat surface 16. A middle portion of the first flat surface 16 is recessed to define a first groove 18. The first groove 18 is bounded by a first bottom surface 182 and two first side surfaces 184. Two first ribs 186 are respectively formed at two ends of the first bottom surface 182. Each first rib 186 connects the two first side surface 184, thereby defining a first cavity 188. The first ribs 186 are lower than the first flat surface 16.

The configuration of the second body 20 is similar as the first body 10. The second body 20 includes a second main portion 22 and a second flange portion 24. The second body 20 has a second flat surface 26 and a second groove 28 is defined in the second flat surface 26. The second groove 28 is bounded by a second bottom surface 282 and two second side surfaces 284. Two second ribs 286 are formed on the second bottom surface 282, thereby defining a second cavity 288.

Figure 3:
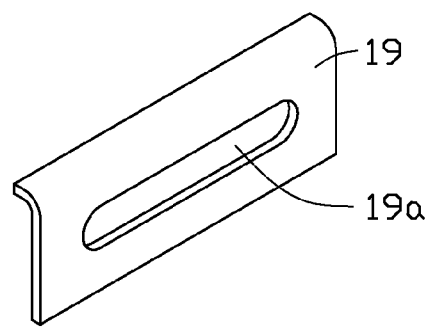
FIG. 3 is a schematic view of a metal plate of the waterproof seal shown in FIG. 1.
Figure 4:
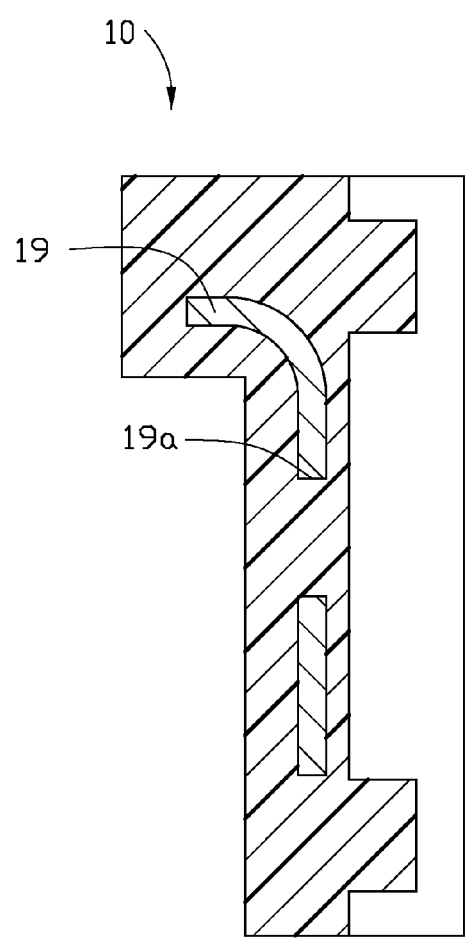
FIG. 4 is a cross-sectional view taken along line IV-IV of FIG. 2.

In this exemplary embodiment, referring to FIGS. 3-4, to improve the strength of the waterproof seal 100, the first body 10 and the second body 20 are each formed with a metal plate 19 by inserting molding. During molding the first body 10/second body 20, the metal plate 19 are set in a cavity of a mold, and melted rubber material is injected into the cavity to form the first body 10/second body 20. Each metal plate 19 defines a plate hole 19a to be filled with the rubber material to increase the bonding force between the metal plate 19 and the rubber material.

Figure 5:
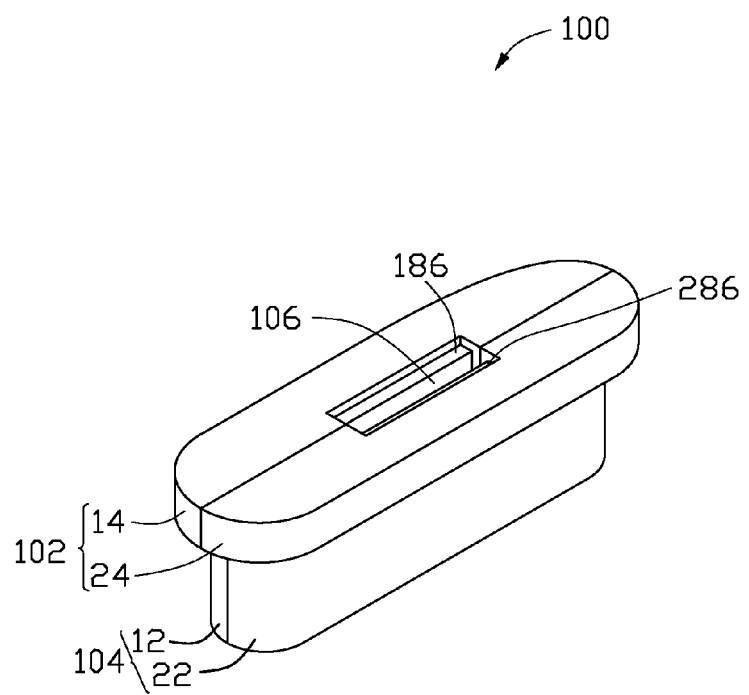
FIG. 5 is an assembled, schematic view of the waterproof seal showing in FIG. 1.

Referring to FIG. 5, when the first body 10 and the second body 20 are combined together, the first flat surface 16 and the second flat surface 26 abut each other. The first flange portion 14 combines the second flange portion 24 to form a combination flange 102. The first main portion 12 combines the second main portion 22 to form a latching portion 104. The first ribs 186 are respectively aligned with the corresponding second ribs 286. A gap 106 is defined between the first body 10 and the second body 20.

Figure 6:
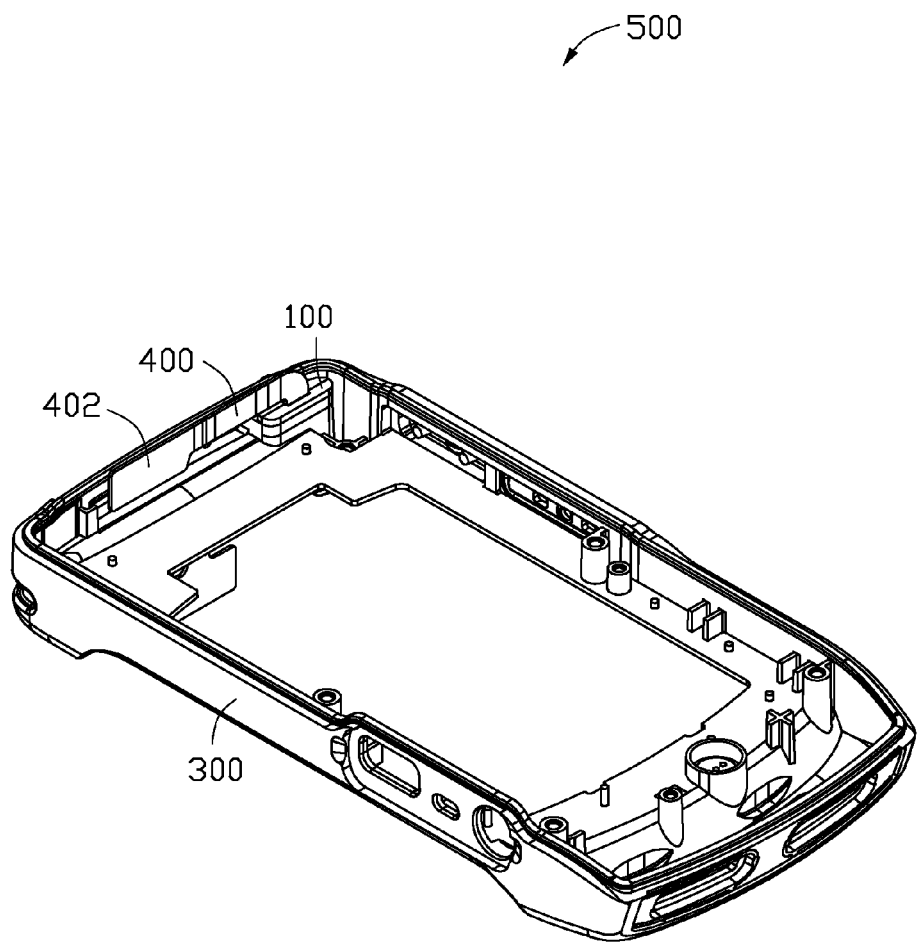
FIG. 6 is similar to FIG. 1, but showing the waterproof seal and the flexible printed circuit board attached to the housing.

Also referring to FIG. 6, in assembly of the waterproof seal 100 to the housing 300, the first cavity 188 and the second cavity 288 are filled into waterproof oil. The first body 10 and the second body 20 are combined together, with the middle portion 406 of the flexible printed circuit board 400 received in the gap 106. The first ribs 186 and the second ribs 286 respectively resist two sides of the flexible printed circuit board 400. The second end 404 of the flexible printed circuit board 400 and the latching portion 104 are positioned at same side of the combination flange 102. In this embodiment, the waterproof oil is a thick mucous, so that the waterproof oil won't flow away from the gap 106. The second end 404 of the flexible printed circuit board 400 passes the through hole 304 of the housing 300, and the latching portion 104 of the waterproof seal 100 is inserted into the through hole 304. The latching portion 104 is engaged into the through hole 304 by interference fit, which prevents water from flowing through the through hole 304.

Figure 7:
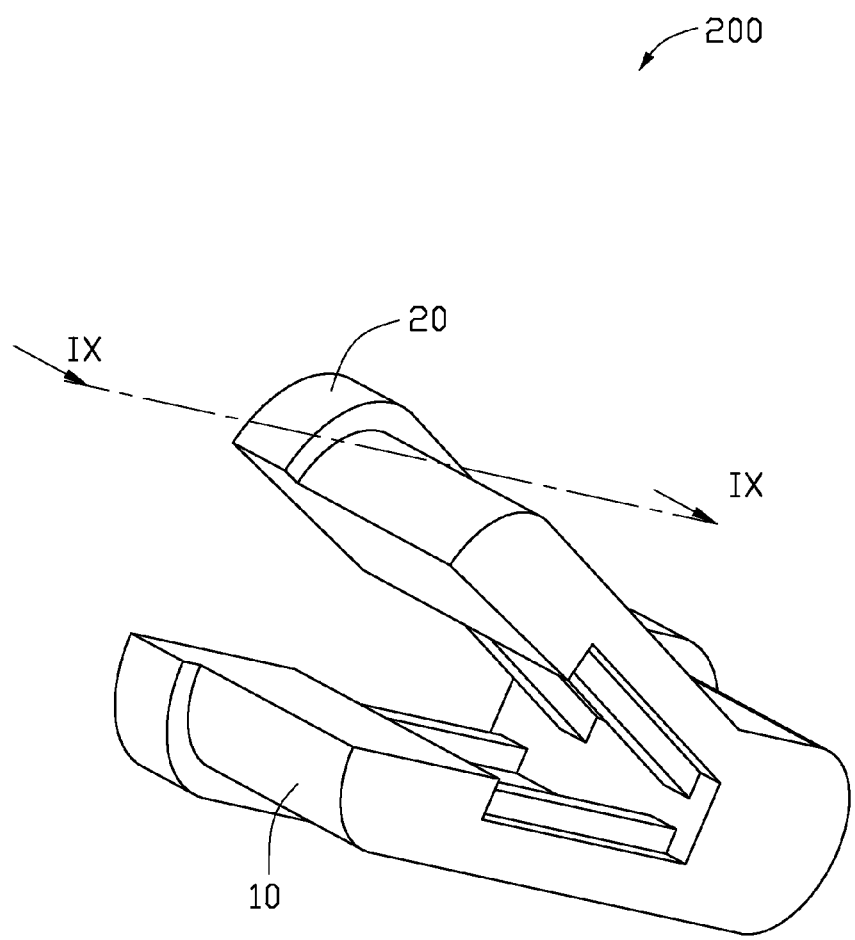
FIG. 7 illustrates another embodiment of a waterproof seal.
Figure 8:
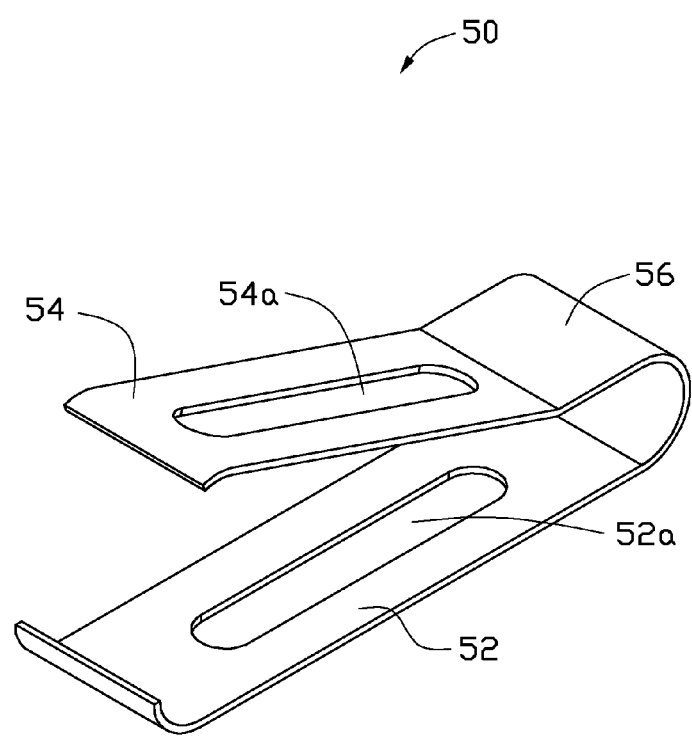
FIG. 8 is a metal plate of the waterproof seal shown in FIG. 7.
Figure 9:
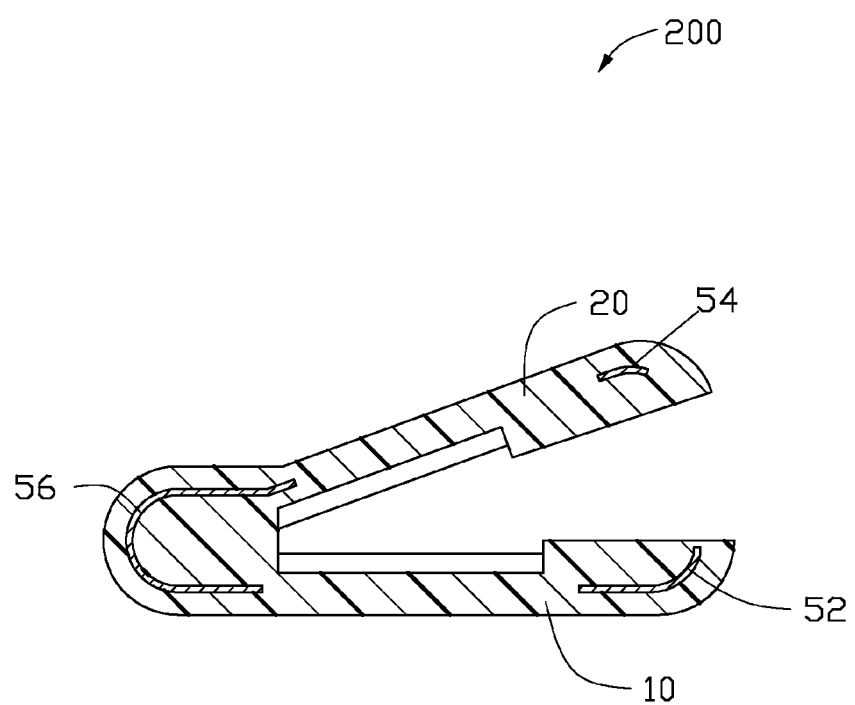
FIG. 9 is a cross-sectional view taken along line IX-IX of FIG. 7.

In another embodiment, referring to FIGS. 7-9, a waterproof seal 200 includes the first body 10 and the second body 20 connected at one end thereof. The waterproof seal 200 is formed with a clamp metal plate 50 by inserting molding, and the first body 10 is integrally formed with the second body 20.

One end of the second body 20 is joined with a corresponding end of the first body 10. The first body 10 is angled with the second body 20, and is rotatable to abut the second body 20. The clamp metal plate 50 applied into mold the waterproof seal 100 in inserting molding includes a first plate 52, a second plate 54 and a connecting portion 56 connecting the first plate 52 and the second plate 54. The first plate 52 and the second plate 54 are respectively received in the first body 10 and the second body 20. The first plate 52 and the second plate 54 respectively define a plate hole 52a/54a to be filled with rubber material to increase the bonding force between the clamp metal plate 50 and the rubber material. The connecting portion is U-shaped, so that the second body 20 is rotatable relative to the first body 10.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A waterproof seal comprising:
    a first body including a first metal plate therein formed by inserting molding, the first body further including a first flat surface, the first body defining a first groove in the first flat surface; and
    a second body including a second metal plate formed by inserting molding and, the second body further including a second flat surface matching the first flat surface, the second body defining a second groove in the second flat surface, when the first flat surface clinging to the second flat surface, and a gap is formed between the first body and the second body for allowing a flexible printed circuit board to extend through.

2. The waterproof seal as claimed in claim 1, wherein the first groove is bounded by a first bottom surface and two first side surfaces, two first ribs are formed on the first bottom surface, the second groove is bounded by a second bottom surface and two second side surfaces, two second ribs are formed on the second bottom surface, and space between the first ribs or the second ribs are for receiving waterproof oil.

3. The waterproof seal as claimed in claim 2, wherein the first body further comprises a first main portion and a first flange portion, the second body further comprises a second main portion and a second flange portion, and when the first flat surface clings to the second flat surface, the first main portion combines the second main portion to be a latching portion, and the first flange portion combines the second flange portion to be a combination flange.

4. The waterproof seal as claimed in claim 3, wherein the first groove extends through the first main portion and the first flange portion, and the second groove extends through the second main portion and the second flange portion.

5. The waterproof seal as claimed in claim 1, wherein each of the first metal plate and the second metal plate defines a plate hole to be filled with rubber material in molding the first body and the second body.

6. A waterproof seal comprising:
    a first body including a first flat surface, the first body defining a first groove in the first flat surface, the first groove being bounded by a first bottom surface and two first side surfaces, two first ribs formed on the first bottom surface; and
    a second body integrally formed with the first body, the second body including a second flat surface matching the first flat surface, the second body defining a second groove in the second flat surface, one end of the second body being joined with one end of the first body, the second body being angled with the first body, when the first flat surface clinging to the second flat surface, a gap being formed between the first body and the second body for allowing a flexible printed circuit board to extend through.

7. The waterproof seal as claimed in claim 6, wherein the second groove is bounded by a second bottom surface and two second side surfaces, two second ribs are formed on the second bottom surface, and space between the first ribs or the second ribs are for receiving waterproof oil.

8. The waterproof seal as claimed in claim 7, wherein the first body further comprises a first main portion and a first flange portion, the second body further comprises a second main portion and a second flange portion, and when the first flat surface clings to the second flat surface, the first main portion combines the second main portion to be a latching portion, and the first flange portion combines the second flange portion to be a combination flange.

9. The waterproof seal as claimed in claim 8, wherein the first groove extends through the first main portion and the first flange portion, and the second groove extends through the second main portion and the second flange portion.

10. The waterproof seal as claimed in claim 6, further comprising a metal plate inside, wherein the metal plate includes a first plate, a second plate and a U-shaped connecting portion connecting the first plate and the second plate, and the second plate is angled with the first plate.

11. The waterproof seal as claimed in claim 10, wherein each of the first plate and the second plate defines a plate hole to be filled with rubber material in molding the waterproof seal.

12. A portable electronic device comprising:
    a housing defining a through hole;
    a flexible printed circuit board;
    a waterproof seal engaged in the through hole of the housing, including:
        a first body including a first metal plate by inserting molding, the first body including a first flat surface, the first body defining a first groove in the first flat surface; and
        a second body including a second metal plate by inserting molding, the second body including a second flat surface matching the first flat surface, the second body defining a second groove in the second flat surface, when the first flat surface clinging to the second flat surface, a gap being formed between the first body and the second body for allowing a flexible printed circuit board to extend through.

13. The portable electronic device as claimed in claim 12, wherein the first groove is bounded by a first bottom surface and two first side surfaces, two first ribs are formed on the first bottom surface, the second groove is bounded by a second bottom surface and two second side surfaces, two second ribs are formed on the second bottom surface, and when the first flat surface clings to the second flat surface, space between the first ribs or the second ribs are for receiving waterproof oil.

14. The portable electronic device as claimed in claim 13, wherein the first body further comprises a first main portion and a first flange portion, the second body further comprises a second main portion and a second flange portion, the first main portion combines the second main portion to be a latching portion, the latching portion is engaged in the through hole by interference fit, and the first flange portion combines the second flange portion to be a combination flange.

15. The portable electronic device as claimed in claim 14, wherein the first groove extends through the first main portion and the first flange portion, and the second groove extends through the second main portion and the second flange portion.

16. The portable electronic device as claimed in claim 12, wherein each of the first metal plate and the second metal plate defines a plate hole to be filled with rubber material in molding the first body and the second body.

* * * * *